United States Patent
Usui et al.

(10) Patent No.: US 8,022,533 B2
(45) Date of Patent: Sep. 20, 2011

(54) CIRCUIT APPARATUS PROVIDED WITH ASPERITIES ON SUBSTRATE SURFACE

(75) Inventors: Ryosuke Usui, Ichinomiya (JP); Hideki Mizuhara, Ichinomiya (JP); Yasunori Inoue, Ogaki (JP)

(73) Assignee: Sanyo Electric Co., Ltd., Osaka (JP)

(*) Notice: Subject to any disclaimer, the term of this patent is extended or adjusted under 35 U.S.C. 154(b) by 536 days.

(21) Appl. No.: 11/168,655

(22) Filed: Jun. 29, 2005

(65) Prior Publication Data

US 2005/0285147 A1    Dec. 29, 2005

(30) Foreign Application Priority Data

| Jun. 29, 2004 | (JP) | 2004-191881 |
| Jun. 29, 2004 | (JP) | 2004-191882 |
| Jun. 29, 2004 | (JP) | 2004-191883 |
| Jun. 29, 2004 | (JP) | 2004-191884 |

(51) Int. Cl.
   *H01L 23/34* (2006.01)
(52) U.S. Cl. ........ 257/712; 257/706; 257/713; 257/718; 257/720; 257/E33.075
(58) Field of Classification Search .......... 257/678, 257/753, E25.005, E25.012, E25.016, E25.02, 257/E25.026, E25.017, 706, 712, 713, 718, 257/720

See application file for complete search history.

(56) References Cited

U.S. PATENT DOCUMENTS

| 4,720,424 A * | 1/1988 | Eickman et al. ............. 428/323 |
| 4,830,704 A   | 5/1989 | Voss et al. |
| 6,528,351 B1 * | 3/2003 | Nathan et al. ................. 438/118 |
| 2004/0101995 A1 * | 5/2004 | Sakai et al. .................... 438/127 |
| 2004/0170019 A1 * | 9/2004 | Tamai ........................... 362/247 |
| 2005/0225222 A1 * | 10/2005 | Mazzochette et al. .......... 313/46 |

FOREIGN PATENT DOCUMENTS

| CN | 1466782 A    | 1/2004 |
| JP | 64-31447     | 2/1989 |
| JP | 8-125117     | 5/1996 |
| JP | 08-162486    | 6/1996 |
| JP | 08-162573    | 6/1996 |
| JP | 10-223832    | 8/1998 |
| JP | 11-126868    | 5/1999 |
| JP | 2001-267340  | 9/2001 |
| JP | 2001-274312  | 10/2001 |
| JP | 2002-094247  | 3/2002 |
| JP | 2004-47543   | 2/2004 |
| JP | 2004-140268  | 5/2004 |

OTHER PUBLICATIONS

Machine Translation of JP 2004/140268.*
Chinese Office Action, Issued in corresponding Chinese Patent Application No. 200510082134.3, dated on Jun. 22, 2007.

(Continued)

*Primary Examiner* — Wai-Sing Louie
(74) *Attorney, Agent, or Firm* — McDermott Will & Emery LLP

(57) ABSTRACT

Circuit elements including a plurality of semiconductor devices and passive elements embedded in an insulating resin film are formed on a metal substrate having a surface roughness Ra of 0.3 to 10 μm. This produces an anchoring effect occurs between the substrate and the insulating film, thereby improving the adhesiveness between the substrate and the insulating resin film.

4 Claims, 8 Drawing Sheets

OTHER PUBLICATIONS

Japanese Office Action issued in Japanese Patent Application No. JP 2004-191882, dated Jun. 24, 2008.
Japanese Office Action issued in Japanese Patent Application No. JP 2004-191883, dated Jun. 24, 2008.
Japanese Office Action issued in Japanese Patent Application No. JP 2004-191884, dated Jun. 24, 2008.
Japanese Notification of Reason(s) for Refusal, w/ English translation thereof, issued in Japanese Patent Application No. JP 2004-191882 dated Feb. 10, 2009.
Japanese Notification of Reason(s) for Refusal, w/ English translation thereof, issued in Japanese Patent Application No. JP 2004-191883 dated Feb. 10, 2009.
Japanese Notification of Reason(s) for Refusal, w/ English translation thereof, issued in Japanese Patent Application No. JP 2004-191884 dated Feb. 10, 2009.
Chinese Office Action issued in Chinese Patent Application No. CN 200810212821.6 dated Apr. 21, 2010.
Chinese Office Action, w/ English translation thereof, issued in Chinese Patent Application No. CN 200810212821.6 dated Oct. 23, 2009.
Chinese Office Action, with English translation, issued in Chinese Patent Application No. 200810212821.6, mailed Aug. 13, 2010.
Japanese Office Action issued in Japanese Patent Application No. JP 2004-191882, dated Jun. 24, 2008.
Japanese Office Action issued in Japanese Patent Application No. JP 2004-191883, dated Jun. 24, 2008.
Japanese Office Action issued in Japanese Patent Application No. JP 2004-191884, dated Jun. 24, 2008.

* cited by examiner

CIRCUIT APPARATUS PROVIDED WITH ASPERITIES ON SUBSTRATE SURFACE

BACKGROUND OF THE INVENTION

1. Field of the Invention

The invention relates to a circuit apparatus and a method of manufacturing the same.

2. Description of the Related Art

Portable electronics equipment including cellular phones, PDAs, DVCs, and DSCs has been advancing at increasingly fast speed. Under the circumstances, miniaturization and weight saving have become essential in order for these products to be accepted in the market. To achieve this, system LSIs of higher integration have been sought after. Meanwhile, enhanced usability and convenience have been desired of such electronics equipment, and functional and performance sophistication has been required of the LSIs to be used for the equipment. Consequently, while the LSI chips of higher integration have grown in the number of I/Os, miniaturization has been highly required of the packages themselves. For the sake of satisfying both the requirements, there has been a strong demand to develop a semiconductor package suited to packaging semiconductor parts on a board at a higher density. To meet this demand, various types of packaging technologies called CSP (Chip Size Package) have been developed.

Among the known examples of such packages is a BGA (Ball Grid Array). In the BGA, semiconductor chips are mounted on the packaging board and molded with a resin before solder balls are formed over an area on the other side of the board as external terminals. Since the BGA realizes a planar mounting area, the package can be miniaturized relatively easily. Besides, the circuit board need not be rendered in narrower pitches, which eliminates the need for high-precision mounting technologies. The BGA can thus be used to reduce the total packaging cost even when the package itself costs relatively high.

FIG. 8 is a diagram showing the general configuration of a typical BGA. The BGA 100 has the structure that an LSI chip 102 is mounted on a glass epoxy board 106 via an adhesive layer 108. The LSI chip 102 is molded with a sealing resin 110. The LSI chip 102 and the glass epoxy board 106 are electrically connected with metal wires 104. Solder balls 112 are arranged in an array on the backside of the glass epoxy board 106. Through these solder balls 112, the BGA 100 is mounted on a printed wiring board.

In such a package, semiconductor chips are sealed by using such techniques as transfer molding, injection molding, potting, and dipping (for example, see Japanese Patent Laid-Open Publication No. Hei 8-162486).

Techniques for achieving a low-profile system LSI of even higher precision and performance have also been disclosed. In the techniques, thin-film technologies and thick-film technologies are used to cover a base board unit with a layer that contains passive elements composed of resistor parts, capacitor parts, and/or pattern wiring parts which are supplied with power or signals from the base-board side through a dielectric insulating layer (for example, see Japanese Patent Laid-Open Publication No. 2002-94247).

Moreover, as an approach to an improved heat radiation characteristic of the system LSI, technologies for using a metal or semiconductor board have also been disclosed (for example, see Japanese Patent Laid-Open Publication No. Hei 10-223832).

According to those conventional CSPs as disclosed in Japanese Patent Laid-Open Publication No. Hei 8-162486, however, it has been difficult to achieve portable electronic equipment and the like that are reduced in size, profile, and weight up to the levels desired at present. The improvement to the heat radiation characteristic has also been limited.

In the techniques of forming a layer containing passive elements composed of resistor parts, capacitor parts, and/or patterned wiring parts as disclosed in Japanese Patent Laid-Open Publication No. 2002-94247, highly complicated processes are used for forming the thin films or thick films. In terms of the manufacturing cost of the passive elements, there has thus been room for further improvement. These complicated processes also have difficulty in flattening the surfaces of the passive elements. There has thus been room for further improvement even in terms of manufacturing stability.

When a metal or semiconductor board is used as disclosed in Japanese Patent Laid-Open Publication No. Hei 10-223832, the adhesiveness between the board and insulating films may be insufficient, possibly causing exfoliation and contributing to a drop in yield. Furthermore, when electronic parts such as an IC chip are mounted on the board, the electronic parts may fall outside their predetermined positions due to insufficient position accuracy. This can also contribute to a drop in yield.

SUMMARY OF THE INVENTION

The present invention has been achieved in view of the foregoing circumstances. It is thus an object of the present invention to provide a technology for improving the adhesiveness between the board and an inter-element insulating film of a circuit apparatus. Another object of the present invention is to provide a technology for improving the heat radiation characteristic of the circuit apparatus.

The present invention provides a circuit apparatus comprising: a metal substrate; an insulating resin film formed on the substrate; and a plurality of circuit elements (including passive elements such as a resistor and a capacitor, and active elements such as a transistor) embedded in the insulating resin film, wherein the surface of the substrate is 0.3 to 10 µm in surface roughness Ra. This produces an anchoring effect between the substrate and the insulating resin film, and thus improves the adhesiveness between the substrate and the insulating resin film.

In the circuit apparatus, the surface of the substrate may have anisotropic asperities. This enhances the anchoring effect between the substrate and the insulating resin film further, and thus improves the adhesiveness between the substrate and the insulating resin film.

In the circuit apparatus, an insulating film may be formed on the surface of the substrate. This can improve the dielectric strength of the substrate.

The present invention also provides a method of manufacturing a circuit apparatus, comprising: roughening a surface of a metal substrate; embedding a plurality of circuit elements in an insulating resin film; and joining the insulating resin film to the substrate. Consequently, an anchoring effect occurs between the substrate and the insulating resin film. It is therefore possible to manufacture a circuit apparatus which has improved adhesiveness between the substrate and the insulating resin film.

The roughening may be performed so that the surface of the substrate is roughened into 0.3 to 10 µm in surface roughness Ra. This enhances the anchoring effect between the substrate and the insulating resin film further, and thus improves the adhesiveness between the substrate and the insulating resin film.

The roughening may be performed so that anisotropic asperities is formed on the surface of the substrate. This enhances the anchoring effect between the substrate and the insulating resin film further, and thus improves the adhesiveness between the substrate and the insulating resin film.

The present invention also provides a circuit apparatus comprising: a metal substrate made of a clad material; an insulating resin film formed on the substrate; and a plurality of circuit elements embedded in the insulating resin film. The substrate is desirably made of a clad material that includes a metal of favorable heat conductivity and a metal of low thermal expansion in combination. Here, the "metal of favorable thermal conductivity" refers to a metal having a thermal conductivity of 200 to 500 W/mK. Examples of the metal include Al, Au, Ag, Cu, and alloys thereof. The "metal of low thermal expansion" refers to a metal having a coefficient of thermal expansion of 0.5 to $5.0 \times 10^{-6}$/K. Examples of the metal include Fe, Ni, and Co alloys. Consequently, heat is transferred from the circuit elements to the substrate quickly while thermal warpage of the substrate is suppressed. This allows an improvement to the adhesiveness between the substrate and the insulating resin film.

In the foregoing configuration, an insulating film is desirably formed on the surface of the substrate. The insulating film may be a metal oxide film, a nitride film, a silicon oxide film, or the like. This can improve the withstand voltage between the substrate and the circuit elements.

A method of manufacturing a circuit apparatus according to the present invention comprises: embedding a plurality of circuit elements in an insulating resin film; and joining the insulating resin film to a surface of a metal substrate made of a clad material. This makes it possible to manufacture a circuit apparatus in which heat is transferred from the circuit elements to the substrate quickly, and the adhesiveness between the substrate and the insulating resin film is improved as well.

The present invention also provides a circuit apparatus comprising: a metal substrate; an insulating resin film formed on the substrate; and a plurality of circuit elements embedded in the insulating resin film, wherein a recess having an embedded heat conductive member is formed in at least one of sides of at least one or more of the circuit elements. In the foregoing configuration, the heat conductive member may be a metal or a semiconductor element. This can facilitate transferring the heat of the circuit element(s) to the board, thereby improving the heat radiation characteristic of the circuit apparatus.

In the foregoing configuration, an insulating film is desirably formed on the surface of the substrate. The insulating film may be a metal oxide film, a nitride film, a silicon oxide film, or the like. This can improve the withstand voltage between the substrate and the circuit elements.

A method of manufacturing a circuit apparatus according to the present invention comprises: forming a recess in at least one of sides of at least one or more circuit elements out of a plurality of circuit elements; embedding a heat conductive member in the recess; embedding the plurality of circuit elements in an insulating resin film; and joining the insulating resin film to a substrate. Consequently, it is possible to manufacture a circuit apparatus which has an improved heat radiation characteristic.

The present invention also provides a circuit apparatus comprising: a metal substrate; an insulating resin film formed on the substrate; and a plurality of circuit elements embedded in the insulating resin film, wherein a plurality of grooves corresponding to the plurality of circuit elements are formed in the substrate, and the plurality of circuit elements are fitted into the corresponding grooves, respectively. This facilitates positioning the circuit elements, thereby improving the manufacturing yield of the circuit apparatus. Besides, fitting the circuit elements into the grooves produces contact areas between the sidewalls of the grooves and the circuit elements. This increases the channels of thermal conduction from the circuit elements to the substrate with a further improvement to the heat radiation characteristic.

In the foregoing configuration, an adhesive layer may be interposed between the substrate and the insulating resin film. This can improve the adhesiveness between the substrate and the insulating resin film.

In the foregoing configuration, an insulating film is desirably formed on the surface of the substrate. The insulating film may be a metal oxide film, a nitride film, a silicon oxide film, or the like. This can improve the withstand voltage between the substrate and the circuit elements.

A method of manufacturing a circuit apparatus according to the present invention comprises: forming a plurality of grooves corresponding to a plurality of circuit elements in a surface of a metal substrate; fitting the plurality of circuit elements into the corresponding grooves and embedding the elements in an insulating resin film; and joining the insulating resin film to the substrate. This facilitates positioning the circuit elements, thereby improving the manufacturing yield of the circuit apparatus. Besides, fitting the circuit elements into the grooves produces contact areas between the sidewalls of the grooves and the circuit elements. This can increase the channels of thermal conduction from the circuit elements to the substrate with a further improvement to the heat radiation characteristic.

Up to this point, description has been given of the configurations of the present invention. Any combinations of these configurations are also intended to constitute applicable aspects of the present invention. Moreover, any conversions of the expressions of the present invention into other categories are also intended to constitute applicable aspects of the present invention.

DETAILED DESCRIPTION OF THE INVENTION

Figure 1A:
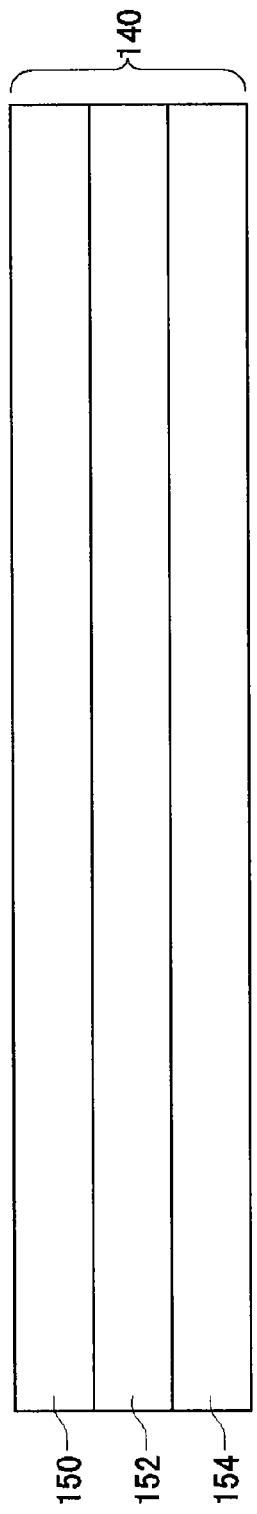
FIGS. 1A and 1B are sectional views for showing the steps of manufacturing a substrate to be used for a circuit apparatus according to an embodiment.

Hereinafter, an embodiment of the present invention will be described with reference to the drawings. Incidentally, in any of the drawings, identical components will be designated by like reference numerals. Description thereof will be omitted as appropriate. As employed herein, an "upward" direction is a concept to be determined by the order of lamination of films. The direction in which a film laminated later lies as viewed from a film laminated before shall be defined as "upward."

Figure 1B:
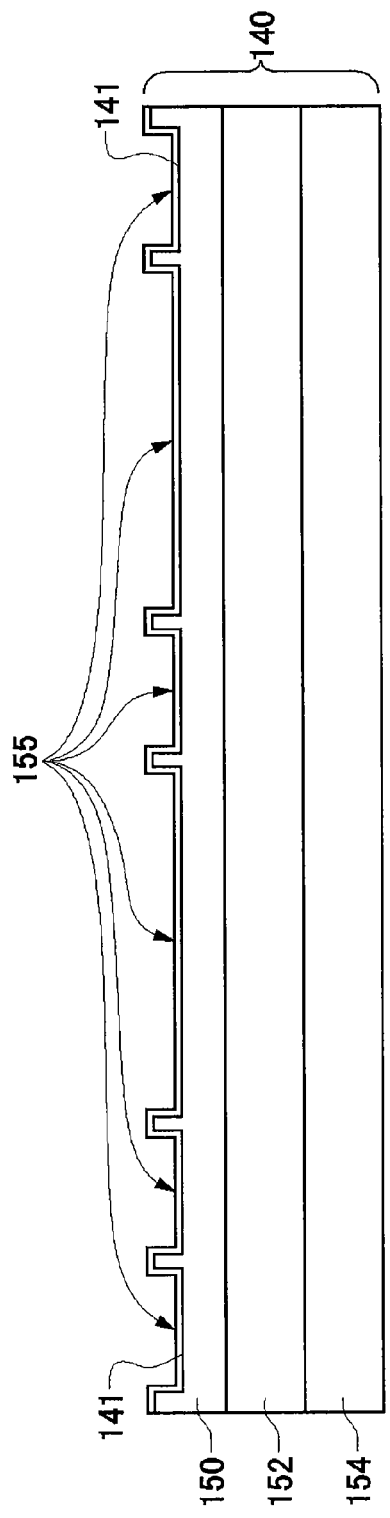

FIGS. 1A and 1B are sectional views for showing the steps of manufacturing a substrate to be used for a circuit apparatus according to the present embodiment. The substrate 140 may be made of a clad material that includes a metal having a coefficient of thermal expansion of 0.5 to $5.0 \times 10^{-6}$/K and a metal having a thermal conductivity of 200 to 500 W/mK in combination. Fe, Ni, and Co alloys are suitable for the metal having a coefficient of thermal expansion of 0.5 to $5.0 \times 10^{-6}$/K. Other metals may also be contained as long as the coefficient of thermal expansion falls within the foregoing range. For the metal having a thermal conductivity of 200 to 500 W/mK, Al, Au, Ag, Cu, and alloys thereof are suitable. Other metals may also be contained as long as the thermal conductivity falls within the foregoing range. As shown in FIG. 1A, the embodiment will deal with the case where the substrate 140 is made of a clad material having a three-layer structure. This clad material is formed by interposing a second metal layer 152 made of an invar alloy between a first metal layer 150 made of copper or aluminum and a third metal layer 154 made of copper, followed by rolling. The individual layers of the clad material may be formed in arbitrary thicknesses. When the clad material is formed as a thick plate, the first metal layer 150 may have a thickness of 200±100 μm, the second metal layer 152 a thickness of 600±150 μm, and the third metal layer 154 a thickness of 200±100 μm. When the clad material is formed as a thin plate, the first metal layer 150 may have a thickness of 70±30 μm, the second metal layer 152 a thickness of 100±50 μm, and the third metal layer 154 a thickness of 30±20 μm. Since the resulting clad material has thermal conductivity and low thermal expansion characteristics in balance, it is therefore possible to improve the heat radiation characteristic of the circuit apparatus, suppresses warpage ascribable to heat from the substrate 140, and improve the adhesiveness to an insulating resin film to be described later.

Subsequently, a patterning resist film (not shown) is formed on the surface of the first metal layer 150 so that openings are formed in the areas for circuit elements to be mounted on. Then, as shown in FIG. 1B, the surface of the first metal layer 150 is etched by using the patterning resist film as a mask, thereby forming grooves 155 in the areas for the circuit elements to be mounted on. Consequently, the grooves 155 are formed in the surface of the first metal layer 150 in conformity to the areas for the circuit elements to be mounted on. When the circuit elements are mounted on the substrate 140, it is therefore easily possible to place the circuit elements on the substrate 140 with precision simply by fitting the circuit elements into the grooves 155. Since the positioning of the circuit elements is facilitated, simplified manufacturing steps and an improved yield are expected. Besides, fitting the circuit elements into the grooves 155 produces contact areas between the sidewalls of the grooves 155 and the circuit elements. This can increase the channels of thermal conduction from the circuit elements to the substrate 140 with a further improvement to the heat radiation characteristic. In terms of the reliability in positioning the circuit elements and an improvement to the heat radiation characteristic, the grooves 155 formed in the surface of the first metal layer 150 desirably have a depth of 20 to 200 μm, and preferably 50 to 100 μm.

Next, the surface of the first metal layer 150 is roughened by wet etching or the like. For example, copper can be wet etched so that asperities corresponding to copper grains appear on the copper surface. The formation of asperities on the surface of the first metal layer 150 facilitates exerting an anchoring effect between the first metal layer 150 and the circuit elements mounted on the substrate 140, and the insulating resin film. This can improve the adhesiveness of the substrate 140 to the circuit elements and the insulating resin film. In terms of securing adhesiveness, the surface of the first metal layer 150 is desirably given asperities of 0.3 to 10 μm, and preferably 1 to 3 μm, in surface roughness Ra. The surface of the first metal layer 150 can be measured for Ra by using a contact type surface profile meter.

In the present embodiment, the surface of the first metal layer 150 is roughened all over. Nevertheless, by using energy irradiation such as laser, asperities may be formed locally at portions where high adhesiveness is desired.

Figure 2A:
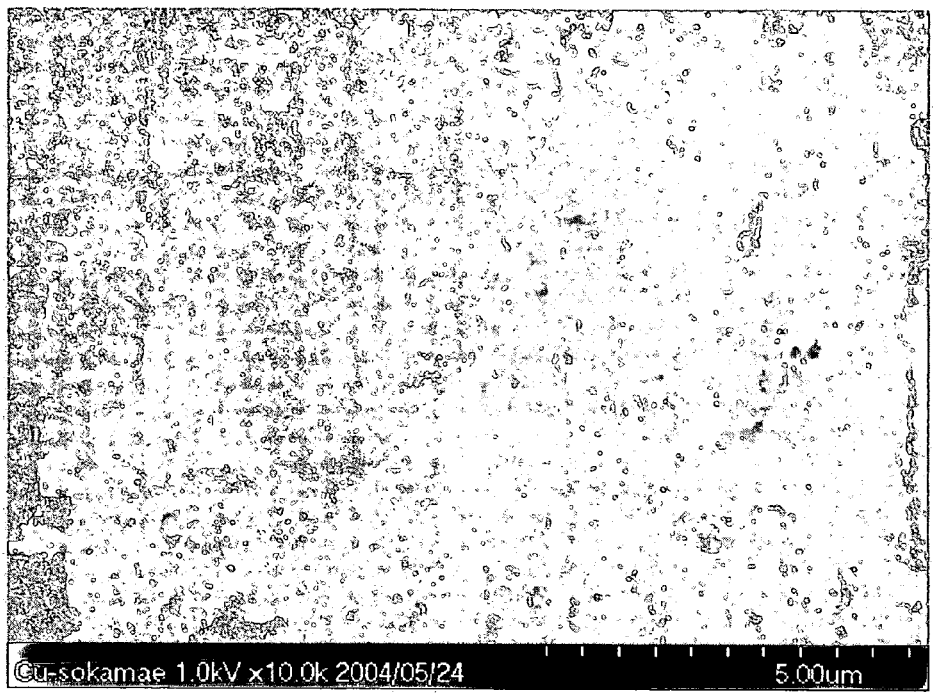
FIGS. 2A and 2B are electron microscope pictures of the surface of a first metal layer before roughening.
Figure 2B:
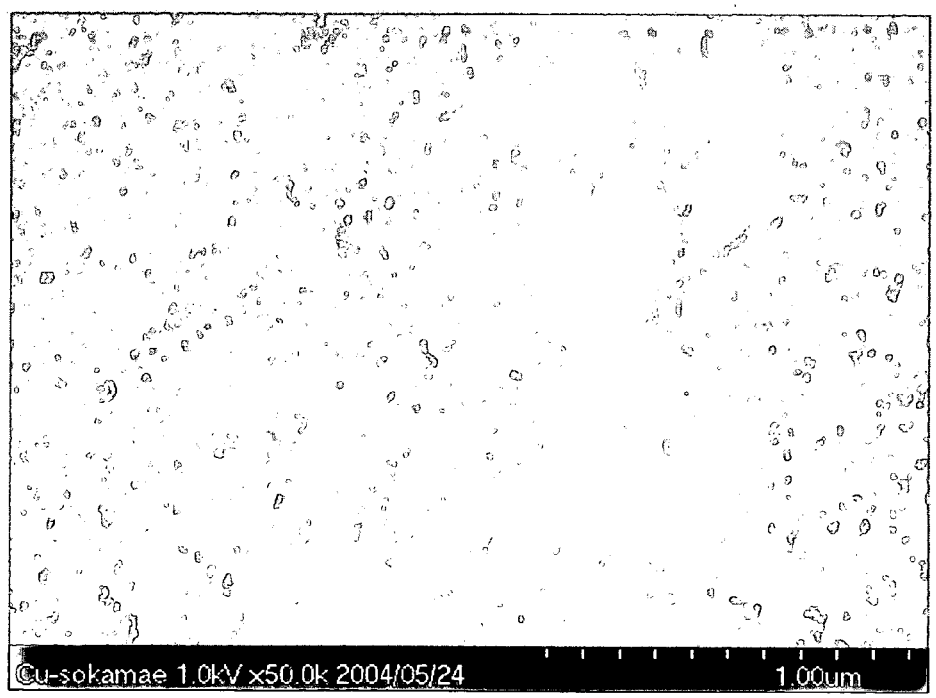
Figure 3A:
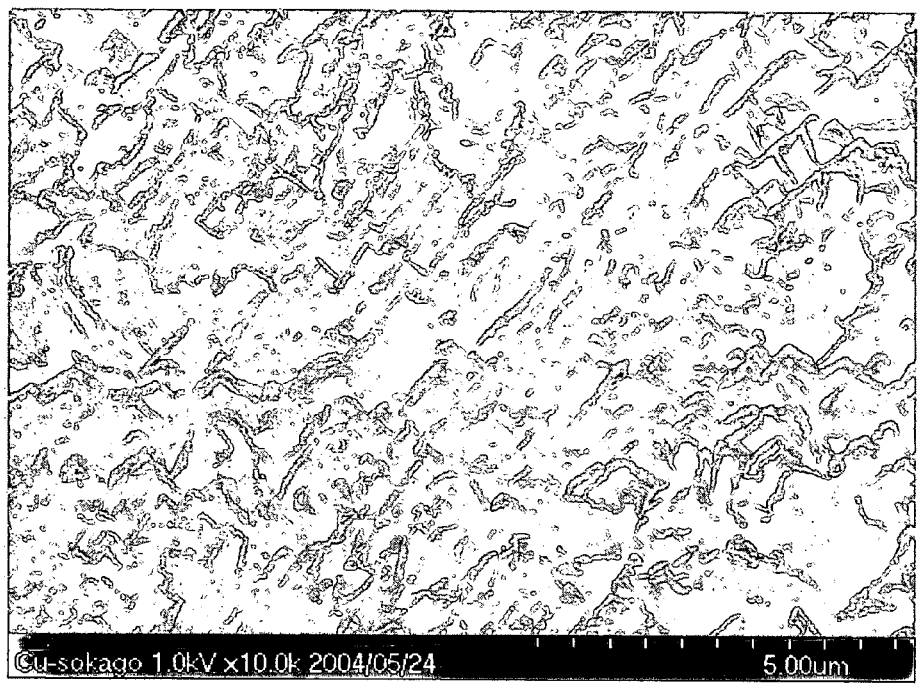
FIGS. 3A and 3B are electron microscope pictures of the surface of the first metal layer after roughening.
Figure 3B:
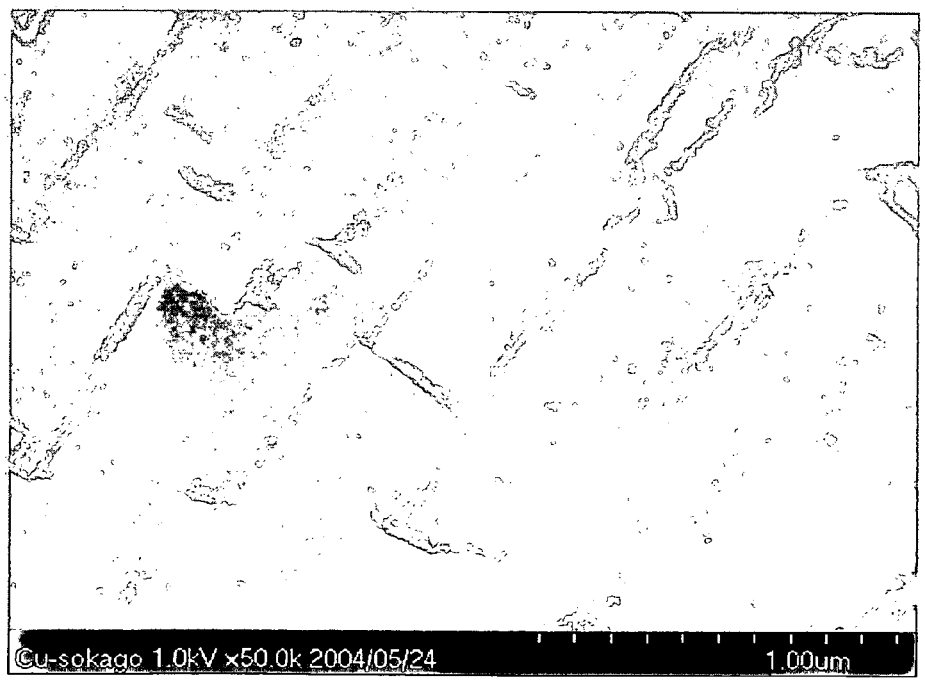

FIGS. 2A and 2B are electron microscope pictures of the surface of the first metal layer 150 before roughening. The magnifications of the electron microscope pictures in FIGS. 2A and 2B are 10000 times and 50000 times, respectively. FIGS. 3A and 3B are electron microscope pictures of the surface of the first metal layer 150 after the roughening. The magnifications of the electron microscope pictures in FIGS. 3A and 3B are 10000 times and 50000 times, respectively. A comparison between FIGS. 2A and 2B and FIGS. 3A and 3B shows that the roughened surface of the first metal layer 150 exposes copper crystal grains and has asperities along the outlines thereof. Since copper crystal grains have their major axes in a certain direction, the asperities on the roughened surface of the first metal layer 150 are anisotropic. The anisotropic asperities thus formed on the surface of the first metal layer 150 can promote the anchoring effect, thereby improving the adhesiveness to the insulating resin film to be described later. The mechanism how the anisotropic asperities on the surface of the first metal layer 150 improve the anchoring effect will be described below.

Figure 4B:
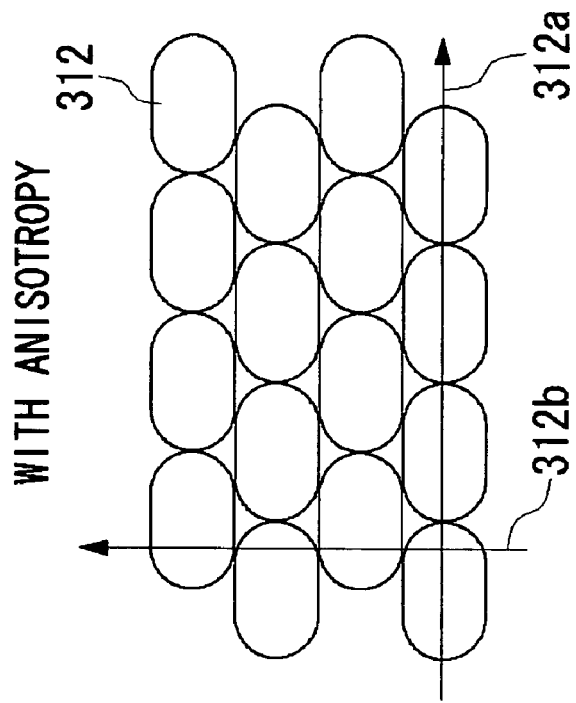
FIG. 4B is a plan view schematically showing crystal grains for situations where asperities on the surface of the first metal layer are anisotropic.
Figure 4A:
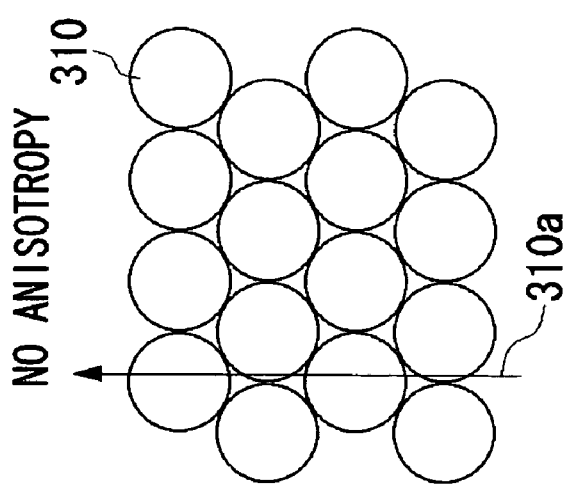
FIG. 4A is a plan view schematically showing crystal grains for situations where asperities on the surface of the first metal layer are not anisotropic.

FIG. 4A is a plan view schematically showing crystal grains 310 for situations where the asperities on the surface of the first metal layer 150 are not anisotropic. FIG. 4B is a plan view schematically showing crystal grains 312 for situations where the asperities on the surface of the first metal layer 150 are anisotropic. As shown in FIG. 4A, when the crystal grains 310 are not anisotropic, the number of crystal boundaries per unit length will not vary depending on the direction (arrow 310a). In other words, the number is not anisotropic. On the other hand, when the crystal grains 312 are anisotropic, as shown in FIG. 4B, the number of crystal boundaries per unit length varies between the longitudinal direction (arrow 312a) and the lateral direction (arrow 312b) of the crystal grains. That is, the number is anisotropic. Since the crystal grains have a three-dimensional structure each, the crystal boundaries have differences in level (see FIGS. 3A and 3B). With the anisotropic crystal structure, boundaries having the same length in two dimensions can thus differ in the total length in three dimensions. Consequently, when the first metal layer 150 and the insulating resin film formed thereon exfoliate from each other, the interface exfoliation progresses anisotropically if the surface of the first metal layer 150 has anisotropic asperities. By utilizing this anisotropic progress of the interface exfoliation, the material of the first metal layer 150 is arranged so that more crystal boundaries lie in such a direction that the interface exfoliation is facilitated (like when the chip is rectangular). Then, the surface of the first metal layer 150 is roughened before the circuit elements are mounted thereon. This can improve the adhesiveness, thereby making it possible to manufacture a semiconductor module of higher reliability.

Now, returning to the description of the method for processing the substrate 140, the substrate 140 is exposed to oxygen so that a metal oxide film 141 is formed on the surface of the first metal layer 150. Forming the metal oxide film 141 on the surface of the first metal layer 150 can improve the withstand voltage of the substrate 140. For example, when the first metal layer 150 is made of copper, copper oxide (CuO) or copper suboxide ($Cu_2O$) is formed on the surface of the first metal layer 150. When the first metal layer 150 is made of aluminum, alumite ($Al_2O_3$) is formed on the surface of the first metal layer 150. Illustration of the metal oxide film 141 is omitted in FIGS. 6A-6E and 7F-7I.

Instead of forming the metal oxide film 141 on the surface of the first metal layer 150, a silicon oxide film may be formed on the first metal layer 150 by plasma CVD or the like. The withstand voltage of the substrate 140 can also be improved by nitriding the first metal layer 150 at the surface. Incidentally, an adhesive layer such as an insulating paste and a silver paste may be applied onto the first metal layer 150. This allows a further improvement to the adhesiveness between the substrate 140 and the circuit elements.

The insulating film formed on the first metal layer 150, such as a metal oxide film, a silicon oxide film, and a nitride film, desirably has a thickness of 0.5 to 10 μm. At thicknesses below 0.5 μm, the insulating film fails to provide a sufficient withstand voltage. At thicknesses above 10 μm, the insulating film has only insufficient adhesiveness to the insulating resin film.

Figure 5A:
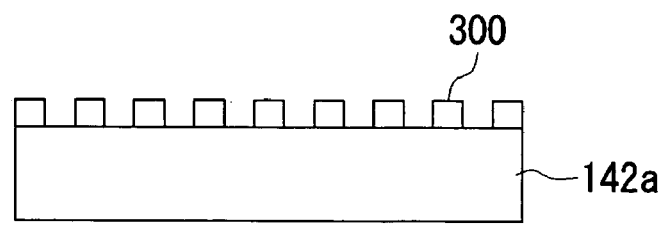
FIGS. 5A, 5B, and 5C are sectional views showing a processing method for enhancing the heat radiation characteristic of a semiconductor device.
Figure 5B:
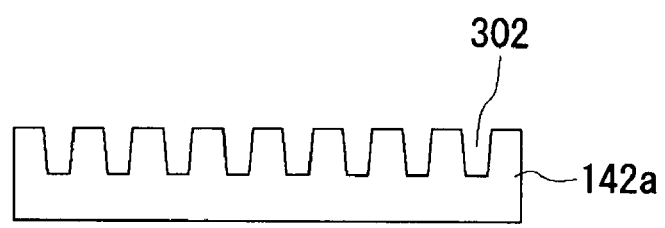
Figure 5C:
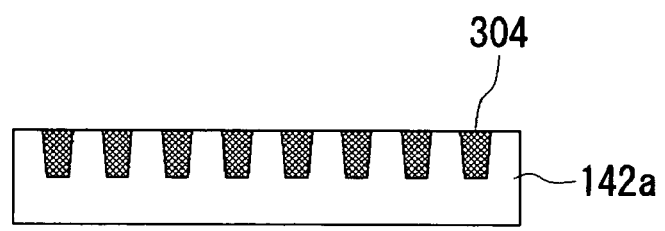

FIGS. 5A to 5C are sectional views showing a processing method for enhancing the heat radiation characteristic of a semiconductor device 142a. Initially, as shown in FIG. 5A, a photoresist 300 having a plurality of openings is formed on the backside of the semiconductor device 142a where to face the substrate 140 (the surface on the side of the substrate 140). Subsequently, as shown in FIG. 5B, the semiconductor device 142a is etched into a plurality of recesses 302 selectively by using the photoresist 300 as a mask. After the photoresist 300 is removed, a metal undercoat film or seed film is formed in the recesses 302. Then, as shown in FIG. 5C, copper or other metal having excellent heat conductivity is embedded into the recesses 302 by electrolytic plating.

When the metal-embedded recesses 302 are thus formed in the backside of the semiconductor device 142a, heat accumulated in the semiconductor device 142a can be transferred easily by the metal inside the recesses 302. This improves the heat radiation characteristic of the semiconductor device 142a.

Incidentally, a plurality of through holes may be formed in the semiconductor devices 142a before a metal having excellent heat conductivity is embedded into the plurality of through holes. This can also improve the heat radiation characteristic of the semiconductor device 142a. The surface to be provided with the recesses 302 is not limited to the backside of the semiconductor device 142a, but may be the top side or both the backside and the top side. Of these, the backside of the semiconductor device 142a is preferably provided with the recesses 302 in terms of improvement to the heat radiation characteristic.

Incidentally, the material to be embedded into the recesses 302 which are formed in at least one of the sides of the semiconductor layer 142a is not limited to metals. For example, semiconductor elements may be used. Among the examples of available semiconductor elements is a Peltier element, which enhances the heat absorbing effect inside the recesses 302 and thus is suited to improving the heat radiation characteristic of the semiconductor device 142a.

Figure 6A:
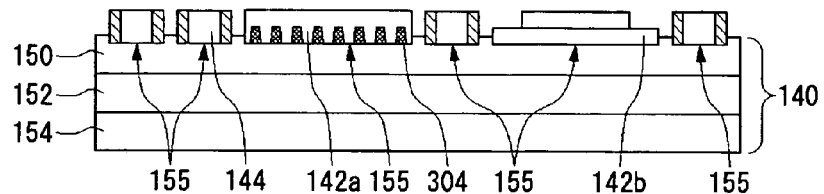
FIGS. 6A, 6B, 6C, 6D, and 6E are sectional views showing the process of mounting circuit elements on the substrate.

FIGS. 6A to 6E and FIGS. 7A to 7D are sectional views showing the process of mounting circuit elements on the substrate 140. Initially, as shown in FIG. 6A, a die chip bonding step is performed. In this step, circuit elements including a plurality of semiconductor devices 142a and 142b and passive elements 144 are bonded onto the substrate 140.

For example, the semiconductor device 142a and the semiconductor device 142b are transistors, diodes, IC chips, or the like. The semiconductor device 142a has a plurality of metal-embedded recesses 304 formed in its backside as described above. The passive elements 144 are chip capacitors, chip resistors, or the like, for example. Incidentally, the passive elements 144 just mentioned may also be formed by using the technique of embedding the materials of part or all of these passive elements 144, or the embedding materials, into recesses in a film containing an inter-element insulating film.

In the present embodiment, the grooves 155 are formed in the surface of the first metal layer 150 in conformity to the areas for the circuit elements to be mounted on. It is therefore possible to place the semiconductor device 142a, the semiconductor device 142b, and the passive elements 144 on the substrate 140 easily with precision by fitting them into the corresponding grooves 155.

Figure 6B:
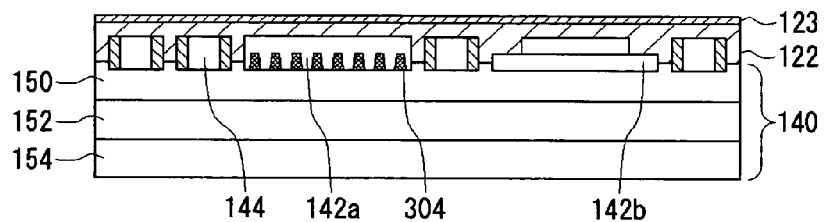

Subsequently, as shown in FIG. 6B, an insulating resin film having a conductive film (hereinafter, referred to as conductored insulating resin film) such as a copper-foiled resin film is attached onto the substrate 140. The semiconductor device 142a, the semiconductor device 142b, and the passive elements 144 are pressed into the insulating resin film 122 by vacuum pressing.

As a result, the semiconductor device 142a, the semiconductor device 142b, and the passive elements 144 are embedded in the insulating resin film 122. This not only attaches and bonds the semiconductor device 142a, the semiconductor device 142b, and the passive elements 144 to inside the insulating resin film 122 by pressure, but also joins the insulating resin film 122 and the substrate 140. Note that while the insulating resin film 122 is interposed between the circuit elements and the substrate 140, it is omitted from FIGS. 6B to 6E and FIGS. 7A to 7D. For the sake of embedding the circuit elements in the insulating resin film 122 with higher reliability, an insulating resin film may be previously deposited on the surface of the first metal layer 150 before the circuit elements are placed on the substrate 140. This can further improves the insulation between the circuit elements placed on the substrate 140.

Moreover, even when the plurality of semiconductor devices 142a and 142b and the passive elements 144 have differences in level, the insulating resin film getting into between the semiconductor device 142a, the semiconductor device 142b, and the passive elements 144 can keep the thickness from the substrate 140 to the conductive film 123 uniform. Consequently, it is possible to improve the dimensional accuracy of the circuit apparatus.

The conductive film 123 is made of a rolled metal such as a rolled copper foil. The insulating resin film 122 may be made of any material as long as it softens by heat. Examples of available materials include epoxy resins, melamine derivatives such as a BT resin, liquid crystal polymers, PPE resins, polyimide resins, fluorine resins, phenol resins, and polyamide bismaleimide. These materials can be used to enhance the rigidity of the circuit apparatus, thereby improving the stability of the circuit apparatus.

The insulating resin film 122 may contain fillers such as fibers. The examples of available fillers include particulates and fibers of $SiO_2$ or SiN. The insulating resin film 122 will be heated to bond the semiconductor device 142a, the semiconductor device 142b, and the passive elements 144 by thermocompression, and then cooled to room temperatures. Then, if the insulating resin film 122 contains fillers or fibers, it is possible to reduce the warpage of the insulating resin film 122 and improve the thermal conductivity as well. This can enhance the adhesiveness between the semiconductor devices 142 and passive elements 144 and the insulating resin film 122. Mixing fibers into the insulating resin film 122 can also increase the rigidity of the insulating resin film 122, thereby allowing easier handling. From the foregoing viewpoint, aramid unwoven fabrics can be used as an ingredient for constituting the insulating resin film 122. The unwoven fabrics provide resin fluidity higher than fabrics, and thus allow an improved workability.

The conductored insulating resin film may be an insulating resin film 122 of sheet form, having a conductive film 123 attached thereto. The conductored insulating resin film may also be formed by applying a resin composition for constituting the insulating resin film 122 onto the conductive film 123 and drying the same. In the present embodiment, the resin composition may contain curing agents, accelerators, and other components unless departing from the object of the present invention. The conductored insulating resin film is placed on the substrate 140 when the insulating resin film 122 is in the B stage (which refers to a state after primary curing, half curing, or temporary curing.

This can enhance the adhesiveness between the insulating resin film 122 and the semiconductor device 142a, semiconductor device 142b, and passive elements 144. Subsequently, the insulating resin film 122 is heated according to the type of the resin of the insulating resin film 122. Under vacuum or reduced pressure, the conductored insulating resin film 122, the semiconductor device 142a, the semiconductor device 142b, and the passive elements 144 are bonded by pressure. In another example, an insulating resin film 122 of sheet form, put in the B stage, may be placed on the substrate 140. The conductive film 123 is then placed thereon, and the insulating resin film 122 is bonded to the semiconductor device 142a, the semiconductor device 142b, and the passive elements 144 by thermocompression so that the conductive film 123 is also bonded to the insulating resin film 122 at the same time. The conductored insulating resin film 122 can also be formed in this way.

Next, a wiring patterning step is performed to form the conductive film 123 into wiring by laser lithography (trepanning alignment) or wet copper etching.

Figure 6C:
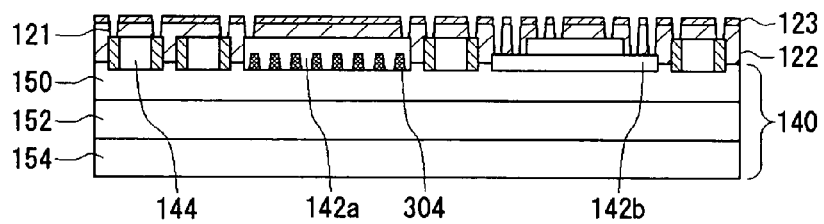

Subsequently, a via hole forming step is performed as shown in FIG. 6C. In this step, via holes (through holes) are formed in the insulating resin film 122 by using carbon dioxide gas laser, YAG laser, and dry etching in combination.

Figure 6D:
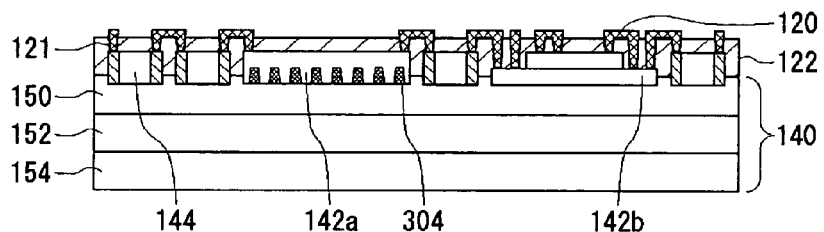

Next, a plating step is performed as shown in FIG. 6D. In this step, electroless copper plating or electrolytic copper plating capable of high aspect ratios is performed to form a conductive film 120. This also fills the through holes with the conductive material to form vias 121. Next, a wiring forming step is performed. In this step, the conductive film 120 is patterned into high density wiring by semi-additive plating, whereby the plurality of semiconductor devices 142a and 142b and the passive elements 144 are electrically connected with each other.

Figure 6E:
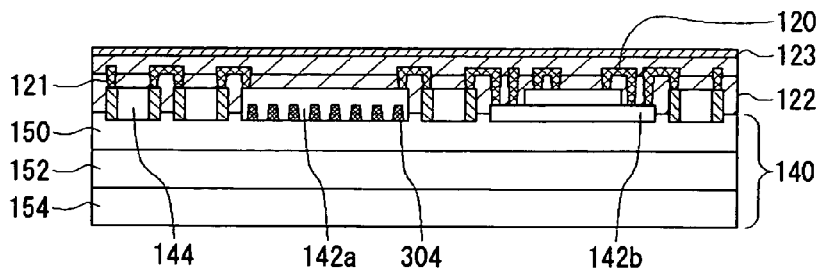

Subsequently, a second insulating resin film forming step is performed as shown in FIG. 6E. In this step, a second insulating resin film having a conductive film 123 is formed so that the conductored insulating resin film 122 is composed of the first insulating resin film and the second insulating resin film. In the conductored insulating resin film, the second insulating resin film is formed on the first insulating resin film, and the conductive film 123 is formed on the second insulating resin film.

In the present embodiment, the second insulating resin film may be made of a material that has higher rigidity than the material of the first insulating resin film shows when the semiconductor device 142a, the semiconductor device 142b, and the passive elements 144 are embedded into the insulating resin film 122 and bonded by thermocompression. This makes it possible to maintain the insulating resin film 122 in a rigid shape while embedding the semiconductor device 142a, the semiconductor device 142b, and the passive elements 144 into the first insulating resin film by the thermocompression.

The second insulating resin film may be made of a material selected as appropriate from among the available materials of the first insulating resin film mentioned above. The available materials include epoxy resins, melamine derivatives such as a BT resin, liquid crystal polymers, PPE resins, polyimide resins, fluorine resins, phenol resins, and polyamide bismaleimide.

The conductive film 123 added onto the second insulating resin film may be a rolled metal such as a rolled copper foil.

Now, the first insulating resin film may be made of a material, for example, that softens easier than the material of the second insulating resin film does. This makes the first insulating resin film easier to deform during thermocompression than the second insulating resin film. Thus, the semiconductor device 142a, the semiconductor device 142b, and the passive elements 144 can be pressed into the first insulating resin film smoothly while the second insulating resin film keeps rigidity and avoids deformation of the entire insulating resin film 122.

Otherwise, for example, the first insulating resin film may be made of a material that has a glass transition temperature lower than that of the material of the second insulating resin film. In another example, the first insulating resin material may be made of a material that has higher adhesiveness to the semiconductor device 142a, the semiconductor device 142b, and the passive elements 144 than the material of the second insulating resin film does. Even in these cases, it is possible to obtain the same effects as described above.

Furthermore, the first insulating resin film and the second insulating resin film may contain fillers such as fibers. In this case, the amount of fillers contained in the first insulating resin film may be made smaller than the amount of fillers contained in the second insulating resin film. Otherwise, the second insulating resin film alone may contain fillers while the first insulating resin film not. These configurations can enhance the flexibility of the first insulating resin film to facilitate embedding the semiconductor device 142a, the semiconductor device 142b, and the passive elements 144. Besides, the warpage of the insulating resin film 122 can be reduced by the second insulating resin film.

As above, the first insulating resin film and the second insulating resin film are made of desirable materials depending on the respective intended purposes. This makes it possible to embed the semiconductor device 142a, the semiconductor device 142b, and the passive elements 144 into the insulating resin film 122 favorably, and enhance the rigidity and improve the formability of the circuit apparatus.

Figure 7A:
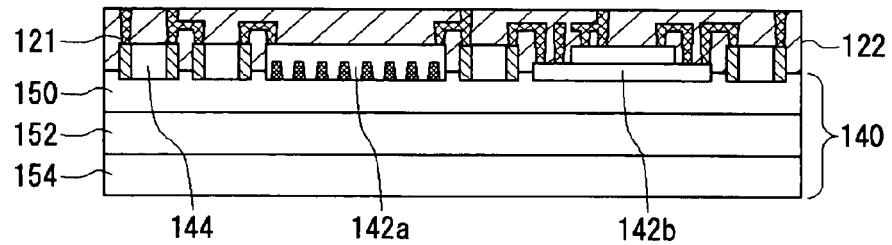
FIGS. 7A, 7B, 7C, and 7D are sectional views showing the process of mounting circuit elements on the substrate.

Next, a second layer wiring forming step is performed as shown in FIG. 7A. This step is effected by repeating the wiring patterning step, the via hole forming step, the plating step, and the wiring forming step on the second insulating resin film and the overlying conductive film in the same manner as described above.

Incidentally, when a laminate film 160 to be further laminated on the second insulating resin film is previously provided with wiring 125 and a conductive film 124 as will be described, additional wiring need not be formed on the surface of the second insulating resin film.

Figure 7B:
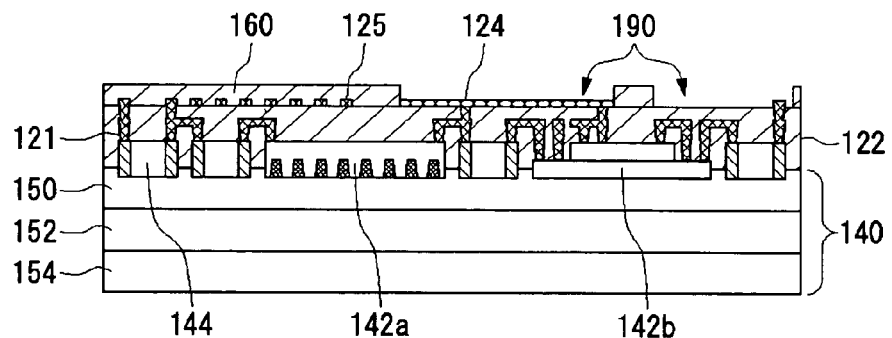

Subsequently, a functional layer forming first step is performed as shown in FIG. 7B. In this step, a laminate film 160 for forming recesses 190 is laminated on the second insulating resin film. This laminate film 160 is previously dented or perforated by laser processing, by pressing, or the like so that it has recesses or through portions. The laminate film 160 thus forms the recesses 190 when bonded to the top of the second insulating resin film by pressure or other means. Each of these recesses 190 may be a dented recess which has a bottom and opens upward alone in the laminate film 160, or a recess that is formed by the top surface of the second insulating resin film and a tunnel-like through portion which opens to both sides of laminate film 160. In either case, the recesses can be similarly filled with an embedding material paste to be described layer.

When a second film provided with recesses or through portions is thus attached to the top of a first film by pressure bonding or the like, the recesses can be formed with higher manufacturing stability as compared to the cases where the films are laminated before the recesses are formed therein by patterning, etching, etc.

In other words, in the present embodiment, the recesses 190 may also be formed in either of the two ways. That is, the laminate film 160 may be laminated on the insulating resin film 122 before the recesses 190 are formed by patterning, etching, etc. Alternatively, the laminate film 160 recessed or perforated in advance may be bonded onto the insulating resin film 122 by pressure.

Incidentally, bonding the laminate film 160 recessed or perforated in advance onto the insulating resin film 122 by pressure is preferable since the manufacturing steps are facilitated.

This laminate film 160 may be an insulating resin film. The insulating resin film, or laminate film 160, may be made of a material that is selected as appropriate from among the available materials of the insulating resin film 122 described above. The available materials include epoxy resins, melamine derivatives such as a BT resin, liquid crystal polymers, PPE resins, polyimide resins, fluorine resins, phenol resins, and polyamide bismaleimide. These materials can be used to insulate the wiring 125 and the conductive film 124 to be described later suitably from other conductive members. Besides, these materials are easy to form recesses and to laminate by a vacuum applying method.

This laminate film 160 is not limited to any particular thickness. In terms of film strength, it may have a thickness of no smaller than 50 nm, or no smaller than 100 nm in particular. This range of thicknesses can suppress damage to the laminate film 160 even when the recesses 190 created by the laminate film 160 are filled with an embedding material by using scraping means 200. While this laminate film has no particular upper limit in thickness, the thickness may be such that the embedded members can function as the component members of the circuit elements.

This laminate film 160 may also be provided with the wiring 125 and the conductive film 124 in advance. For example, the wiring 125 and the conductive film 124 can be formed by processing a rolled metal such as a rolled copper foil. The provision of the wiring 125 and the conductive film 124 in advance eliminates the need for an additional wiring forming step or conductive film forming step. This simplifies the steps of manufacturing the circuit apparatus, thereby allowing an improvement to the manufacturing cost and the manufacturing stability.

The step of laminating the laminate film 160 for forming the recesses 190 may include the step of laminating this laminate film by a vacuum applying method or a reduced-pressure applying method. Here, the vacuum applying method or reduced-pressure applying method refers to a method in which this laminate film 160 is bonded by thermo-compression or the like in a vacuum or reduced-pressure atmosphere. When the vacuum applying method or reduced-pressure applying method is used thus, it becomes harder for air bubbles and the like to get into between the second insulating resin film and the laminate film 160 or the embedded members. This improves the electric contact of the embedded members such as a resister 180 and a capacitor 175 with other conductive members, thereby allowing high-speed signal transmission. Otherwise, the manufacturing cost and the manufacturing stability of the circuit apparatus are improved.

Figure 7C:
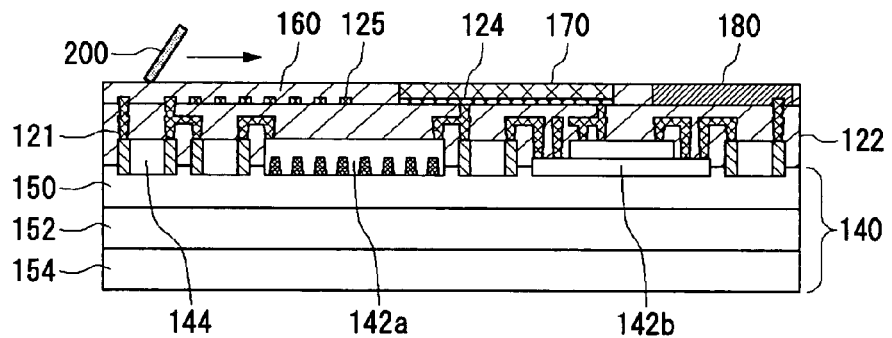

Next, a functional layer forming second step is performed as shown in FIG. 7C. This step includes the steps of: embedding an embedding material paste into the recesses 190 created by this laminate film 160; and forming the embedded members from this embedding material by applying a drying process or the like thereto. Here, the embedded members shall constitute part or all of the circuit elements such as the resistor 180 and a high dielectric constant member 170 for forming the capacitor 175 to be described later.

When the embedded members for constituting part or all of the circuit elements are thus formed by embedding the embedding material paste into the recesses 190 created by the laminate film 160 and processing the same, the step of forming the embedded members is simplified. Consequently, the embedded members for constituting part or all of the circuit elements, including the resistor 180 and the high dielectric constant member 170 for forming the capacitor 175 to be described later, can be rendered flat (bumpless) at the surface. It is therefore possible to provide a circuit apparatus of reduced size or profile with high manufacturing stability.

Here, the embedded members for constituting part or all of the circuit elements may be ones for constituting passive elements or the like. For example, these embedded members may constitute part or all of the passive elements such as the resistor 180 and the capacitor 175 to be described later. Given that an embedded member is one for constituting part or all of the resistor 180, this embedded member may be made of any material, or any embedding material, as long as the material has a high resistance. The examples of available materials include carbon and metal-containing materials such as Ni—Cr (nichrome).

Given that an embedded member is a high dielectric constant member 170 for forming the capacitor 175 to be described later, this embedded member may be made of any material as long as the material has a high dielectric constant. The examples of available materials include activated charcoal and other carbon materials having high specific surface areas, and ones containing tantalum pentoxide or the like.

Incidentally, the lower electrode or higher electrode of the capacitor may be made of a conductive metal. For example, thin film electrodes made of copper, aluminum, and the like may be used.

Now, suppose that capacitors are formed in the circuit apparatus by ordinary steps using such techniques as CVD, pattering, and etching. The capacitors typically include members made of different types of materials, or a high dielectric constant member and electrode members. This makes the top surfaces of the capacitors difficult to flatten, produces burrs and the like easily, and makes precision etching difficult. Thus, there is room for improvement even in terms of manufacturing stability.

On the other hand, when the capacitors are formed by embedding the high dielectric constant material into the recesses as in the present embodiment, neither a lithographic technique nor etching is required. This improves the manufacturing stability, facilitates precision processing, and reduces the production of burrs and the like for lower impurity contamination.

Moreover, when the capacitors are formed by embedding the high dielectric constant material into the recesses as in the present embodiment, the lower electrodes or top electrodes of the capacitors need not have exactly the same planar configuration as that of the high dielectric constant members. This facilitates alignment and increases the design margin for manufacturing, so that the manufacturing stability is also improved in this respect.

These embedding materials may be in a paste form, having solid powders suspending in a solvent. Such material pastes are capable of being embedded into the recesses 190 easily by using the scraping means 200 to be described later.

This embedding step may include the embedding these embedding materials by using the scraping means 200 such as a squeegee. By the use of the scraping means 200 such as a squeegee, the recesses 190 can be filled with the embedding materials completely. Excesses of the embedding materials are removed by the scraping means 200. Since the step of manufacturing the embedded members is simplified and the embedded members for constituting part or all of the circuit elements are flattened at the surface, it is possible to manufacture a circuit apparatus of reduced profile or size with high manufacturing stability.

If ready-made passive elements such as resistors and capacitors are mounted, the passive elements and the areas on which the passive elements are mounted tend to cause a gap therebetween. The chances of such a gap are low, however, when the embedding materials are embedded by using the foregoing scraping means. The reason is that the scraping means presses and bonds the embedding materials to the mounting areas. According to the present embodiment, it is therefore possible to avoid a deterioration in the characteristics of the circuit apparatus ascribable to such gaps.

Alternatively, this embedding step may include the step of embedding these embedding materials by a screen method. Here, the screen method refers to a kind of screen printing method in which a screen made from silk, chemical fibers such as Tetron and nylon, metal fibers, or the like is used.

When the screen method is employed, the embedding materials are formed with their top surfaces in touch with the screen surface. This facilitates forming a surface at the top of the laminate film and a surface at the top of the component member into a flat surface easily, so that films further laminated thereon also have flat top surfaces. It is therefore possible to provide a circuit apparatus of reduced size or profile with high manufacturing stability. Here, if no other member is arranged inside the recesses in advance, a surface at the bottom of this laminate film and a surface at the bottom of this component member also form a flat surface.

In the present embodiment, the screen method is conducted by the following steps. Initially, a screen is put across a frame, and pulled all around and fixed with tension. A resist is formed thereon by a mechanical or optical engineering (photographic) method, so that meshes other than necessary strokes are stopped to make a master. Next, an embedding material is put inside the frame, and the inner area of the screen is pressed along by the scraping means 200 such as a paddle-shaped rubber plate called squeegee. As a result, the embedding material is pressed out through the unstopped portions of the screen into the recesses 190 in the laminate film 160, or the surface to be printed, which is put under the master. The recesses are thus filled up completely.

The method of manufacturing a circuit apparatus according to the present embodiment may further comprise the step of removing the remainder of this embedding material lying outside the recesses 190 of this laminate film 160 by using the scraping means 200 such as a squeegee. When the step of removing the embedding material is provided thus, the excess of the embedding material can be removed from above the laminate film after the recesses 190 are filled up completely. It is therefore possible to flatten the top surface of the laminate film, and avoid a deterioration in the characteristics of the circuit apparatus ascribable to the presence of the remainder of the embedding material.

For example, in this step of removing the embedding material, the top surface of the laminate film 160 may be scraped off by the scraping means 200 such as a squeegee. In this case, the step of embedding the embedding material into the recesses 190 in the laminate film 160 and the step of removing this embedding material may be executed in an identical step. The execution in an identical step can improve the manufacturing cost and the manufacturing stability of the circuit apparatus.

Now, the step of drying this embedding material to form the embedded members such as the resistor 180 and the high dielectric constant member 170 for forming the capacitor 175 to be described layer may include the step of heating this embedding material, the laminate film 160 having this embedding material in its recesses 190, or the entire circuit apparatus under fabrication to dry this embedding material. Moreover, the step of drying this embedding material to form the embedded members may be identical to the step of bonding the laminate film 160, an insulating resin film, to other members by thermocompression. The execution in an identical step can improve the manufacturing cost and the manufacturing stability of the circuit apparatus.

According to such a manufacturing method, it is possible to provide a circuit apparatus comprising a laminate film and embedded members embedded in this laminate film, wherein a surface at the top of this laminate film and a surface at the top of the embedded members form a flat surface. Here, if no other member is arranged inside the recesses in advance, a surface at the bottom of this laminate film and a surface at the bottom of these embedded members form a flat surface. It should be noted that the flat surface formed by the surfaces at the top or bottom of the laminate film and at the top or bottom of the embedded members need not be perfectly flat, but may have some pits and projections as long as it is substantially flat.

Since the circuit apparatus having the foregoing configuration is configured so that the surfaces at the top of the laminate film and at the top of the embedded members form a flat surface, additional thin films laminated thereon also have a flat surface at the top. This makes it possible to provide a circuit apparatus of reduced size or profile with high manufacturing stability. Moreover, the configuration that the surfaces at the bottom of the laminate film and at the bottom of the embedded members form a flat surface improves the interlayer adhesiveness to the underlying film.

Figure 7D:
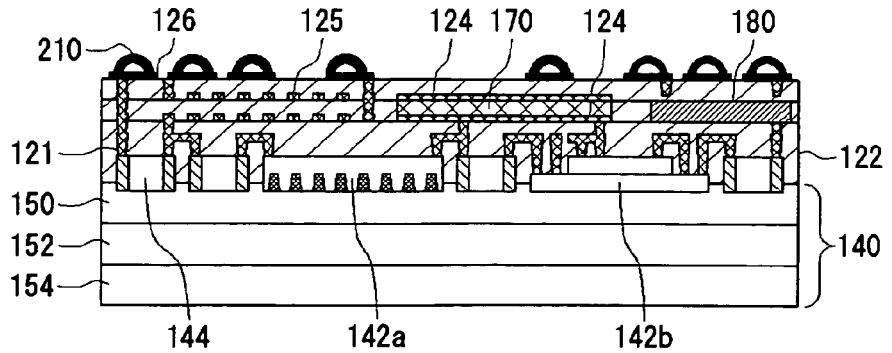
Figure 8:
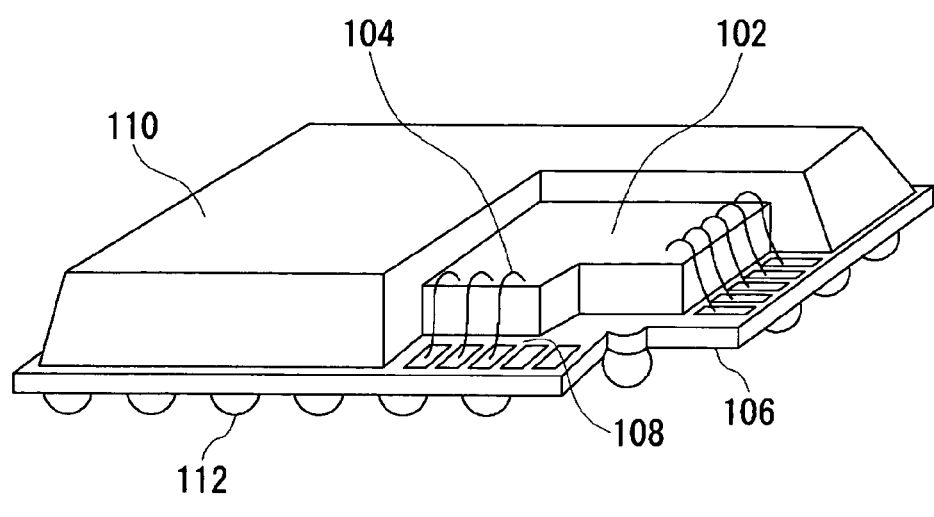
FIG. 8 is a diagram showing the general configuration of a typical BGA.

Next, a third layer wiring forming step is performed as shown in FIG. 7D. In this step, an additional insulating resin film and an overlying conductive film are further formed over the laminate film and the component members of the circuit apparatus. The wiring patterning step, the via hole forming step, the plating step, and the wiring forming step are then repeated as described above. Subsequently, a solder electrode forming step is performed. In this step, solder electrodes (solder balls) 210 are formed by solder printing or the like, as backside electrodes on the conductive film 126 which is formed on the topmost layer.

As will be described, in the circuit apparatus formed thus, the wiring layer is formed by laminating a conductored insulating resin film over another conductored insulating film. The plurality of semiconductor devices 142a and 142b and the passive elements 144 can thus be connected electrically with each other, and connected electrically with other devices.

According to the steps of manufacturing the circuit apparatus according to the present embodiment, it is possible to embed and seal the plurality of semiconductor devices 142a and 142b and the passive elements 144 into the insulating resin film 122 by a simple method. Moreover, the circuit apparatus can be improved in heat radiation characteristic. The circuit apparatus can also be reduced in size. The adhesiveness between the substrate 140 and the insulating resin film 122 of the circuit apparatus can also be improved.

According to the present embodiment, it is possible to realize a multi-chip SiP by using wafer processes and the technologies and apparatuses of ISB (Integrated System in Board™). It is also possible to form insulating films and copper wiring over a plurality of LSIs at the same time by using the vacuum applying method. In addition, a bumpless structure can be achieved for the sake of high-speed signal transmission and low profile packaging. This makes it possible to build passive elements into the circuit apparatus, thereby allowing the provision of a low-profile multifunction SiP.

Up to this point, the present invention has been described in conjunction with the embodiment thereof. This embodiment is given solely by way of illustration. It will be understood by those skilled in the art that various modifications may be made thereto, and all such modifications are also intended to fall within the scope of the present invention.

For example, the method of embedding an embedding material into recesses in the surface of a film is not limited to the one using the screen method. Alternatively, the embedding material may be applied to the entire top surface of this film before the embedding material lying outside the recesses is removed by scraping means or the like. For instance, the embedding material may be laminated on the entire top surface of this film by using CVD or the like before the excess of the embedding material lying outside the recesses is scraped off with a squeegee or the like.

Otherwise, the embedding material may be placed on part of the top surface of this film. In this case, the embedding material is moved in a lateral direction and passed over the recesses with scraping means so that the embedding material is filled into the recesses. For instance, a paste containing a carbon material may be applied to near the recesses on the film. Then, this paste is scraped and moved across the film with a squeegee so that the paste is moved over the recesses and filled into the recesses.

Moreover, the method by which the wiring layer establishes electric connection between layers is not limited to that of embedding a conductive material into through holes. For example, the electric connection may be established by using wires. In this case, the wires may be covered with a sealant.

Now, as shown in FIGS. 6A to 7D, the semiconductor device 142b may include a first device and an overlying second device as its circuit components. Among the examples of possible combinations of the first device and the overlying second device are an SRAM and a Flash memory, and an SRAM and a PRAM. In this case, the first device and the overlying second device can be electrically connected by vias.

The material of the laminate film 160 is not limited to the insulating resin film. A carbon material for forming a resistor and a high dielectric constant material for forming a component member of a capacitor may be used. In this case, an insulating resin material can be used as the embedding material to be embedded into the recesses 190 in the laminate film 160. This configuration is particularly effective when the areas for forming resistors and component members of capacitors occupy a large proportion of the laminate film, and the insulating resin film occupies small.

The foregoing embedding materials are not limited to the form of a paste. For example, dry powered materials, softened resin materials, and the like may also be used as long as they have texture capable of being embedded into the recesses in the film by using scraping means.

The method of processing the embedding materials intended to form the embedded members for constituting part or all of the circuit elements such as a capacitor and a resistor is not limited to the drying process. For example, a variety of processes including baking, pressure bonding, compression, setting, solidification, molding, cross-linking, curing, and modification may be used depending on the characteristics of the embedded members intended.

What is claimed is:

1. A circuit apparatus comprising:
a metal substrate;
an insulating resin film formed on the substrate; and
a plurality of circuit elements embedded in the insulating resin film,
wherein a plurality of grooves corresponding to the plurality of circuit elements are formed in the substrate,
the surface of the substrate inside the plurality of grooves has asperities,
the plurality of circuit elements are fitted into the corresponding grooves, respectively, and
the asperities are anisotropic, and more crystal boundaries lie in such a direction that interface exfoliation of the substrate from the insulating resin film is facilitated.

2. The circuit apparatus according to claim 1, wherein an adhesive layer is interposed between the substrate and the insulating resin film.

3. The circuit apparatus according to claim 1, wherein an insulating film is formed on the surface of the substrate.

4. The circuit apparatus according to claim 2, wherein an insulating film is formed on the surface of the substrate.

* * * * *